(12) United States Patent
Chen et al.

(10) Patent No.: US 10,943,909 B2
(45) Date of Patent: Mar. 9, 2021

(54) METHOD OF FORMING SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventors: Yi-Wei Chen, Taichung (TW); Hsu-Yang Wang, Tainan (TW); Chun-Chieh Chiu, Keelung (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/001,949

(22) Filed: Jun. 7, 2018

(65) Prior Publication Data

US 2019/0341388 A1 Nov. 7, 2019

(30) Foreign Application Priority Data

May 7, 2018 (CN) .......................... 201810425155.8

(51) Int. Cl.
*H01L 27/108* (2006.01)
*H01L 21/76* (2006.01)
*H01L 21/768* (2006.01)

(52) U.S. Cl.
CPC .. *H01L 27/10888* (2013.01); *H01L 21/76804* (2013.01); *H01L 21/76805* (2013.01);

(Continued)

(58) Field of Classification Search
CPC ......... H01L 21/76877; H01L 21/76897; H01L 27/10823; H01L 27/10885;

(Continued)

(56) References Cited

U.S. PATENT DOCUMENTS 9,082,647 B2 7/2015 Jang et al.
9,082,755 B2 7/2015 Kim
(Continued)

FOREIGN PATENT DOCUMENTS

CN 102237393 A 11/2011
CN 102339829 A 2/2012

OTHER PUBLICATIONS

Liu, Title of Invention: Semiconductor Device and Method for Fabricating the Same, U.S. Appl. No. 15/896,091, filed Feb. 14, 2018.

*Primary Examiner* — Mohammed Shamsuzzaman
(74) *Attorney, Agent, or Firm* — Winston Hsu

(57) ABSTRACT

A method of forming a semiconductor memory device includes the following steps. First of all, a substrate is provided, and a plurality of gates is formed in the substrate, along a first direction. Next, a semiconductor layer is formed on the substrate, covering the gates, and a plug is then in the semiconductor layer, between two of the gates. Then, a deposition process is performed to from a stacked structure on the semiconductor layer. Finally, the stacked structure is patterned to form a plurality of bit lines, with one of the bit lines directly in contact with the plug.

2 Claims, 7 Drawing Sheets

(52) U.S. Cl.
CPC .. *H01L 21/76814* (2013.01); *H01L 21/76819* (2013.01); *H01L 21/76895* (2013.01); *H01L 27/10876* (2013.01); *H01L 27/10885* (2013.01)

(58) Field of Classification Search
CPC ......... H01L 27/10888; H01L 29/66704; H01L 29/7827; H01L 27/10876; H01L 21/76804; H01L 21/76805; H01L 21/76814; H01L 21/76819; H01L 21/768895
See application file for complete search history.

(56) References Cited

U.S. PATENT DOCUMENTS

| | | | |
|---|---|---|---|
| 9,142,536 B2 | 9/2015 | Kim | |
| 9,165,934 B2 | 10/2015 | Choi et al. | |
| 9,178,051 B2 | 11/2015 | Yu | |
| 9,230,853 B2 | 1/2016 | Yu et al. | |
| 9,287,395 B2* | 3/2016 | Jeong | G11C 16/0466 |
| 2011/0086503 A1* | 4/2011 | Lim | H01L 21/823456 438/586 |
| 2011/0260288 A1* | 10/2011 | Sukekawa | H01L 21/76897 257/532 |
| 2012/0132970 A1* | 5/2012 | Park | H01L 27/10888 257/296 |
| 2012/0193796 A1 | 8/2012 | Lin et al. | |
| 2012/0217559 A1 | 8/2012 | Kim | |
| 2013/0264638 A1* | 10/2013 | Jang | H01L 23/5384 257/334 |
| 2015/0303201 A1 | 10/2015 | Lee et al. | |
| 2016/0072051 A1* | 3/2016 | Iwayama | H01L 43/08 257/421 |
| 2016/0247901 A1 | 8/2016 | Yuan et al. | |
| 2016/0268262 A1 | 9/2016 | Yoo | |

\* cited by examiner

METHOD OF FORMING SEMICONDUCTOR MEMORY DEVICE

BACKGROUND OF THE INVENTION

1. Field of the Invention

The present invention relates to a method of forming a semiconductor memory device, and more particularly, to a method of forming a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

It is one of the primary objectives of the present invention to provide a method of forming a semiconductor memory device, which is able to form the bit lines with planar top surface for achieving better performance.

To achieve the purpose described above, the present invention provides a method of forming a semiconductor memory device including the following steps. First of all, a substrate is provided, and a plurality of gates is formed in the substrate, along a first direction. Next, a semiconductor layer is formed on the substrate, covering the gates, and a plug is then in the semiconductor layer, between two of the gates. Then, a deposition process is performed to from a stacked structure on the semiconductor layer. Finally, the stacked structure is patterned to form a plurality of bit lines, with one of the bit lines directly in contact with the plug.

Overall speaking, the forming method of the present invention utilizes the additionally formed sacrificial layer and the oxide layer or the additionally performed chemical mechanical polishing process and cleaning process rather before or after etching back the conductive layer, to sufficiently remove the protruding etching profiles caused by the loading effect of the conductive layer. Through the above mentioned forming method, it is allowable to obtain the bit line contacts with planar top surfaces, as well as the stacked layers (such as the barrier layer and the conductive layer) over the bit lines also with planar top surface. That is, the forming method of the present invention may therefore obtain a semiconductor memory device with a preferable structure under a simplified process flow.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 6 are schematic diagrams illustrating a method of forming a semiconductor memory device according to the first preferred embodiment of the present invention, in which:

FIG. 2 shows a cross-sectional view of a semiconductor memory device after forming a semiconductor layer;

FIG. 3 shows a cross-sectional view of a semiconductor memory device after forming a plug hole;

FIG. 4 shows a cross-sectional view of a semiconductor memory device after forming a conductive layer;

FIG. 5 shows a cross-sectional view of a semiconductor memory device after performing an etching back process;

FIG. 6 shows a cross-sectional view of a semiconductor memory device after removing an oxide layer.

FIG. 7 to FIG. 11 are schematic diagrams illustrating a method of forming a semiconductor memory device according to a second preferred embodiment of the present invention, in which:

FIG. 7 shows a cross-sectional view of a semiconductor memory device after forming a sacrificial layer;

FIG. 8 shows a cross-sectional view of a semiconductor memory device after performing an etching back process;

FIG. 9 shows a cross-sectional view of a semiconductor memory device after performing another etching back process;

FIG. 10 shows a cross-sectional view of a semiconductor memory device after removing an oxide layer;

FIG. 11 shows a cross-sectional view of a semiconductor memory device after forming a stacked structure.

DETAILED DESCRIPTION

To provide a better understanding of the presented invention, preferred embodiments will be described in detail. The preferred embodiments of the present invention are illustrated in the accompanying drawings with numbered elements.

Figure 1:
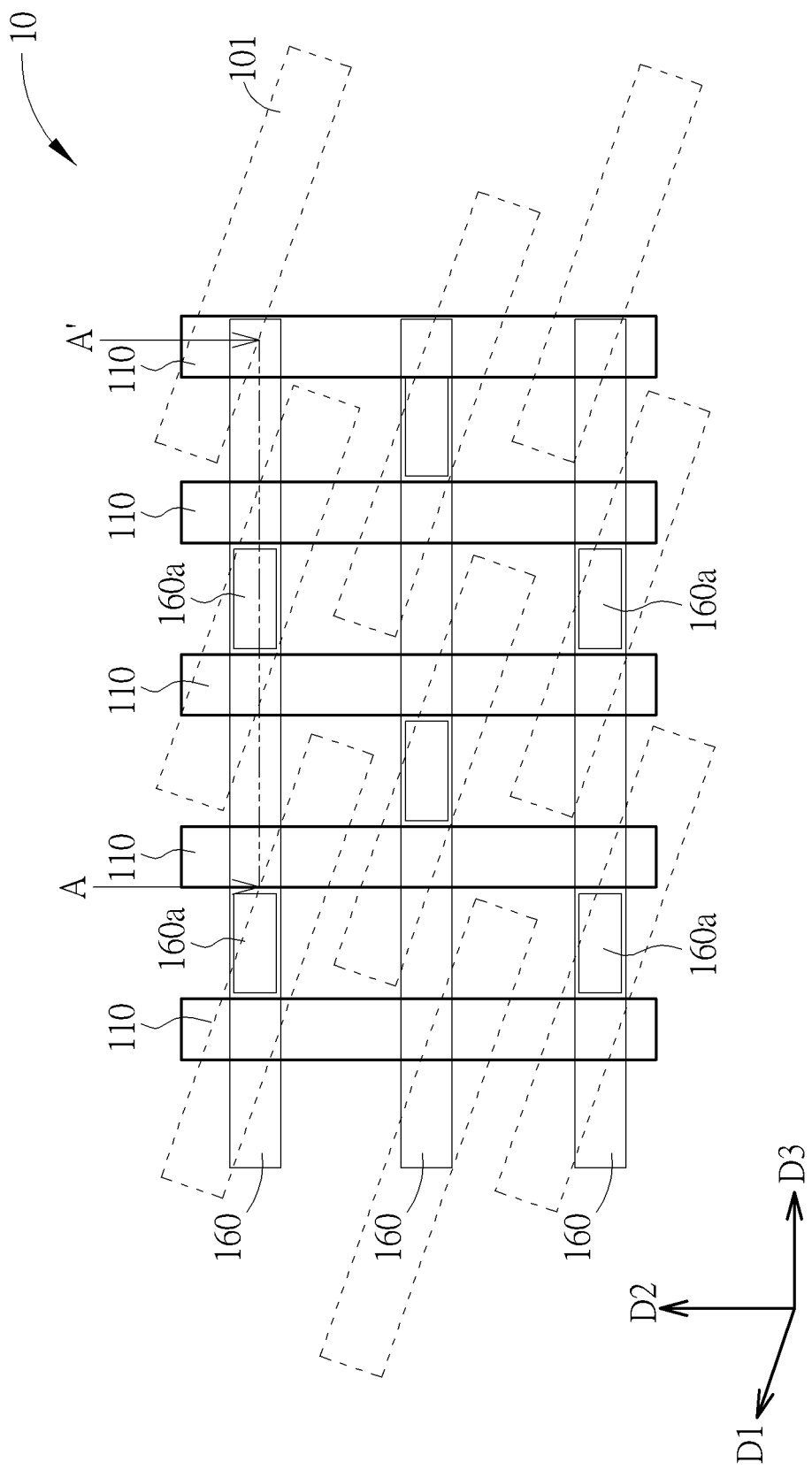
FIG. 1 is a schematic diagram illustrating a top view of a semiconductor memory device according to a first preferred embodiment of the present invention.

Please refer to FIG. 1, which is a schematic diagram illustrating a semiconductor memory device according to the preferred embodiment of the present invention. The semiconductor memory device for example includes a dynamic random access memory (DRAM) device 10, and which includes at least one transistor (not shown in the drawings) and at least one capacitor (not shown in the drawings), thereto serve as the smallest unit in the DRAM array for accepting signals from word lines (WLs) 110 and bit lines (BLs) 160 during the operation.

In the present embodiment, the DRAM device 10 includes a plurality of active area 101 which is parallel extended along a first direction D1, and a plurality of word lines 110 which is parallel extended along a second direction D2 within a substrate 100, across the active area 101 in the first direction D1. The DRAM device 10 further includes a plurality of bit lines 160 which is parallel extended along a third direction D3 on the substrate 100, the bit lines 160, to simultaneously cross the active areas 101 and the word lines 110. The extending direction (namely the third direction D3) of the bit lines 160 is different from that (namely the third directions D1, D2) of the active areas 101 and the word lines 110, and which is preferably perpendicular to the extending direction of the word line 110 (namely the third direction D2) and is not perpendicular to the extending direction of the active areas 101 (namely the third direction D1). Also, the bit lines 160 are electrically connected to a source/drain region (not shown in the drawings) of each transistor through bit line contacts 160a, and the bit line contacts 160a are formed below the bit lines 160, between any two adjacent word lines 110, as shown in FIG. 1.

The formation of the DRAM device 10 is for example accomplished as shown in FIGS. 2-6 which illustrate the forming processes of the DRAM device according to the first preferred embodiment of the present invention. Also, FIGS. 2-6 respectively show a cross-sectional view taken along the cross line A-A' in FIG. 1 during the forming process. Firstly, the substrate 100 is provided, such as a silicon substrate, an epitaxial substrate or a silicon-on-insulator (SOI) substrate, and at least one shallow trench isolation (STI) 106 is formed in the substrate 100 to define the active areas 101.

Figure 2:
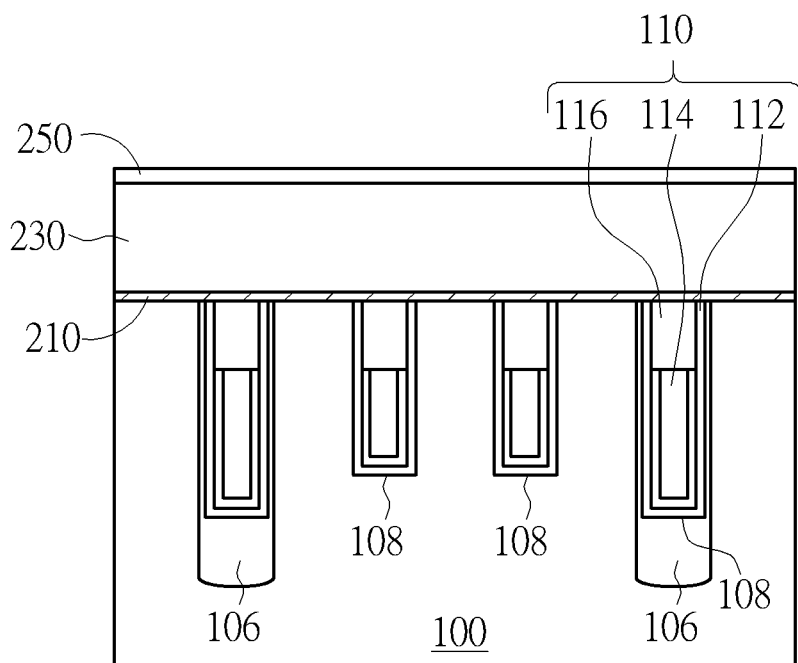

Then, a plurality of gates such as a plurality buried gates 114 as shown in FIG. 2 is formed in the substrate 100. In one embodiment, the formation of the buried gates 114 is carried out by firstly forming a plurality of trenches 108 in the substrate 100, parallel extending along the second direction D2, followed by sequentially forming a dielectric layer 112 covering entire surfaces of each trench 108, a buried gate 114 filled in a bottom portion of each trench 108, and an insulating layer 116 filled in a top portion of each trench 108, in each trench 108. It is noted that, the insulating layer 116 has a top surface leveled with a top surface of the substrate 100, so that, the buried gates 114 formed in the substrate 100 may therefore function like the word lines 110 as shown in FIG. 1.

Next, an insulating layer 210, a semiconductor layer 230 and a protection layer 250 are formed sequentially on the substrate 100. The insulating layer 210 for example includes an oxide-nitride-oxide (ONO) structure, and which is directly formed on the substrate 100 to directly in contact with the insulating layer 116 over the buried gates 114. The semiconductor layer 230 for example includes amorphous silicon (A-Si) and which includes a thickness for example ranged from 40 nm to 50 nm for defining the height of the contact plug 160a formed subsequently. The protection layer 250 for example includes silicon oxide, to protect the semiconductor layer 230 underneath to keep from any damage during the subsequent process.

Figure 3:
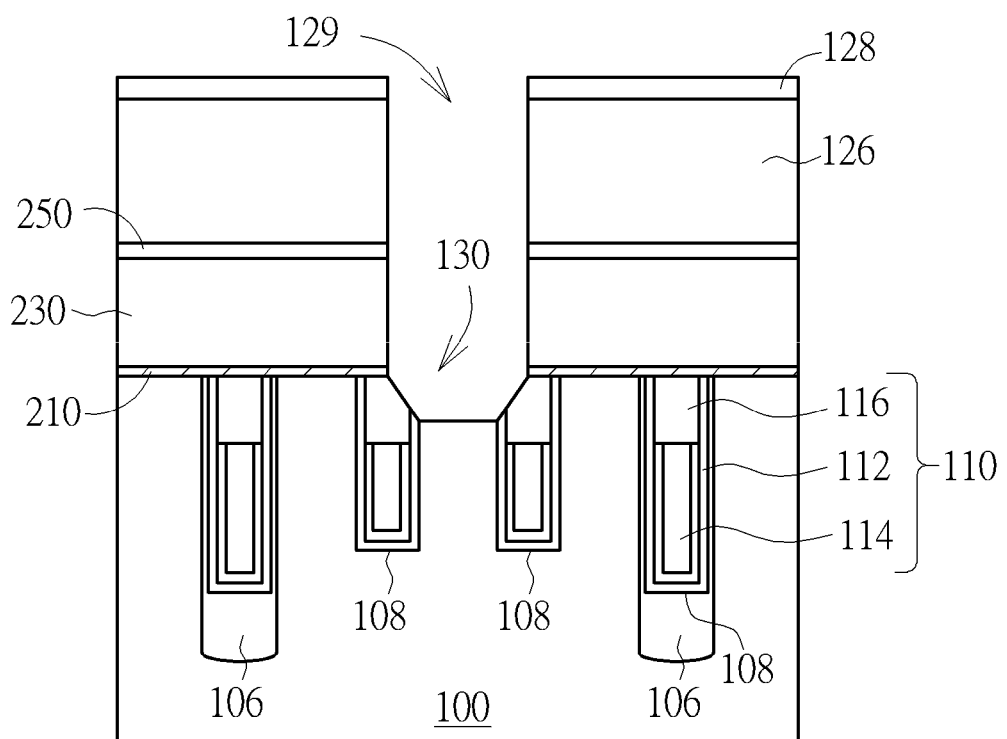

Next, a mask layer such as a tri-layered photoresist layer is formed in the substrate 100, the photoresist layer for example includes a sacrificial layer 126 such as an organic dielectric layer (ODL), a silicon-containing hard mask (SHB) and a patterned photoresist layer (not shown in the drawings) stacked one over another on the substrate 100. The patterned photoresist layer includes at least one opening pattern (not shown in the drawings) for defining the plug hole, so that, an opening 129 may be formed in the SHB 128 and the sacrificial layer 126 while transferring the opening pattern into the layers underneath. Then, the opening 129 is used to perform an etching process, to remove the insulating layer 210 and a portion of the substrate 100 exposed from the opening 129 to form a plug hole 130 in the substrate 100 as shown in FIG. 3. The plug hole 130 is preferably formed between two adjacent word lines 110, so as to expose a portion of the substrate 100 from a bottom of the plug hole 130. After forming the plug hole 130, the SHB 128 and the sacrificial layer 126 are completely removed.

Figure 4:
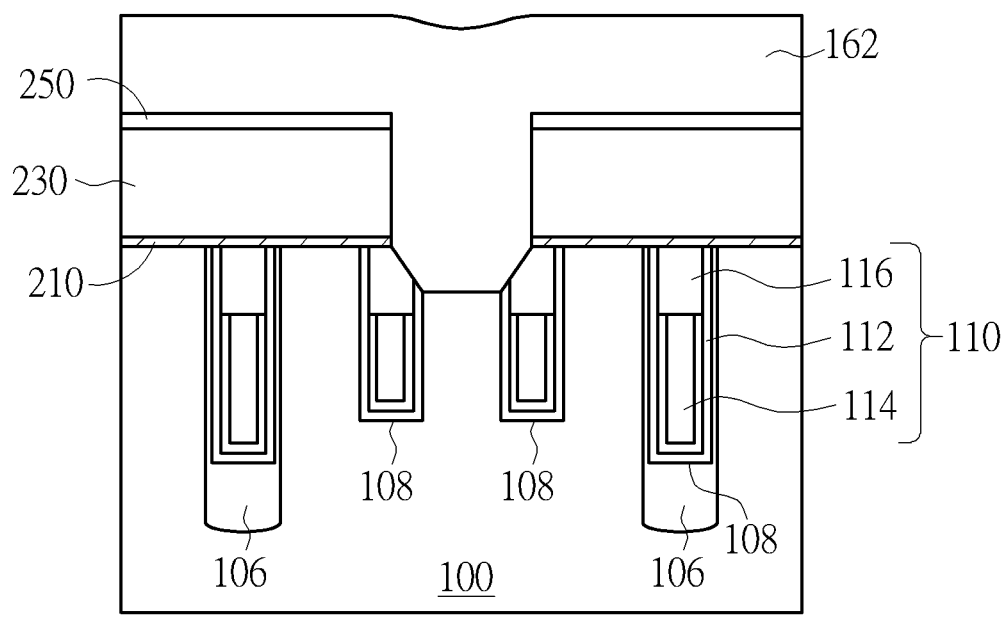

As shown in FIG. 4, a chemical vapor deposition process is performed to form a conductive layer 162 on the substrate 100, with the conductive layer 162 being formed on the protection layer 250 to fill in the plug hole 130. In the present embodiment, the conductive layer 162 for example includes a conductive material like SiP with a greater concentration of P, but is not limited thereto. It is noted that, while forming the conductive layer 162, a portion of the conductive layer 162 filled in the plug hole 130 usually has a lower, sunken top surface as shown in FIG. 4 related to other portions of the conductive layer 162 due to the poor gap-filling capacity of the conductive material.

Figure 5:
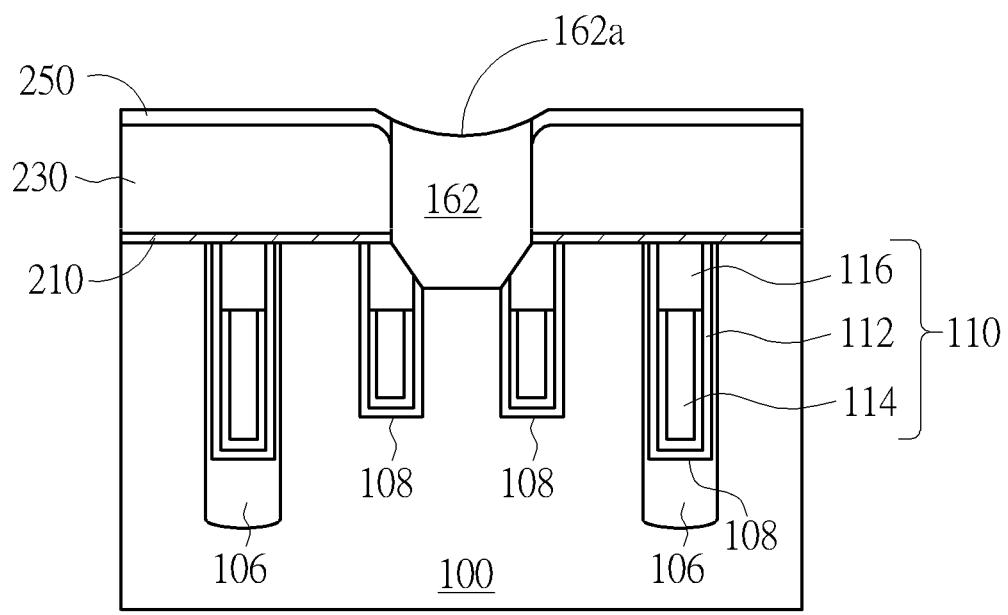

Following these, an etching back process such as a dry etching process is performed, to completely remove the conductive layer 162 disposed on the protection layer 250 to expose the protection layer 250, and to further remove a portion of the conductive layer 162 filled in the plug hole 130. Precisely speaking, since the conductive material (such as SiP) usually has serious loading effect, the etching profiles may vary by different etching performances on different portion of the conductive layer 162. For example, while etching the conductive layer 162 filled in the plug hole 130, the etching performance is relative slower at the portion of the conductive layer 162 adjacent to the protection layer 250, and the etching performance is relative faster at the center portion of the conductive layer 162, so as to from the etching profile with sunken top surface at the center as shown in FIG. 5. With this situation, in order to avoid the possible height difference between the conductive layer 162 and surrounding elements, the etching parameter such as the etching time of the etching back process is preferably adjusted to make the sunken portion 162a at the center top surface of the conductive layer 162 level with the top surface of the semiconductor layer 230 at two sides thereof, as shown in FIG. 5.

Figure 6:
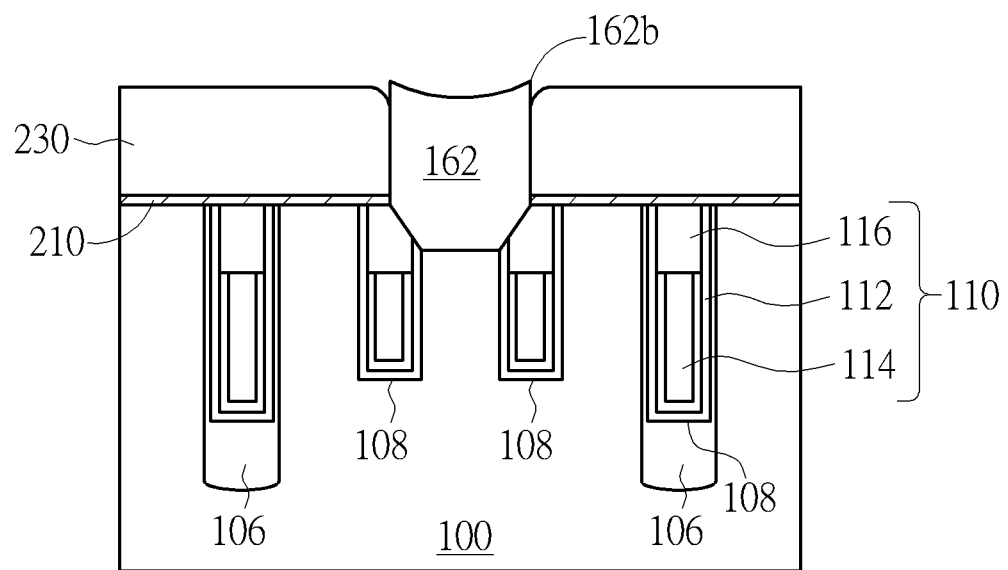

Thus, after removing the protection layer 250 in the subsequent process, the center top surface of the conductive layer 162 remains level with the top surface of the semiconductor layer 230, as shown in FIG. 6, and the forming process of the DRAM device according to the first preferred embodiment of the present invention is completed thereby. According to the aforementioned processes, at least a barrier layer (not shown in the drawings) such as including a titanium (Ti) layer, a titanium nitride (TiN) layer and/or a tungsten silicon layer (WSi), and a conductive layer (not shown in the drawings) such as including a low-resistant metal like tungsten (W), aluminum (Al) or copper (Cu) may be formed on the conductive layer 162 in the subsequent process, followed by patterning the conductive layer and the barrier layer to form the bit lines 160 as shown in FIG. 1. The conductive layer 162 formed within the plug hole 130 may therefore function like the bit line contacts 160a under the bit lines 160, so that, the bit lines 160 may further connects to a source/drain region (not shown in the drawings) of the transistor through the bit line contacts 160a. Also, the bit lines 160 and the word line 110 are isolated from each other by the insulating layer 210 formed on the substrate 100 and the insulating layer 116 formed on the buried gates 114. In this way, the semiconductor memory device obtained in the present embodiment is able gain a better performance under a simplified process.

However, in some situation, the etching profile of some portion of the conductive layer 162 remains protruding beyond other portion and the top surface of the semiconductor layer 230 after removing the protection layer 250, such as a taper protrusion 162b as shown in FIG. 6. The taper protrusion 162b may cause negative effects on the subsequent formed barrier layer and the conductive layer, leading to uneven surfaces or uneven deposition of the barrier layer and the conductive layer, for example. Under such situation, the semiconductor memory device may obtain a poor structure.

Thus, people in the art shall easily realize that the method of forming semiconductor memory device of the present invention is not limited to be formed through the aforementioned processes, and may also be formed through other forming methods to meet the product requirements. The following description will detail the different embodiments of the forming method of semiconductor memory device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
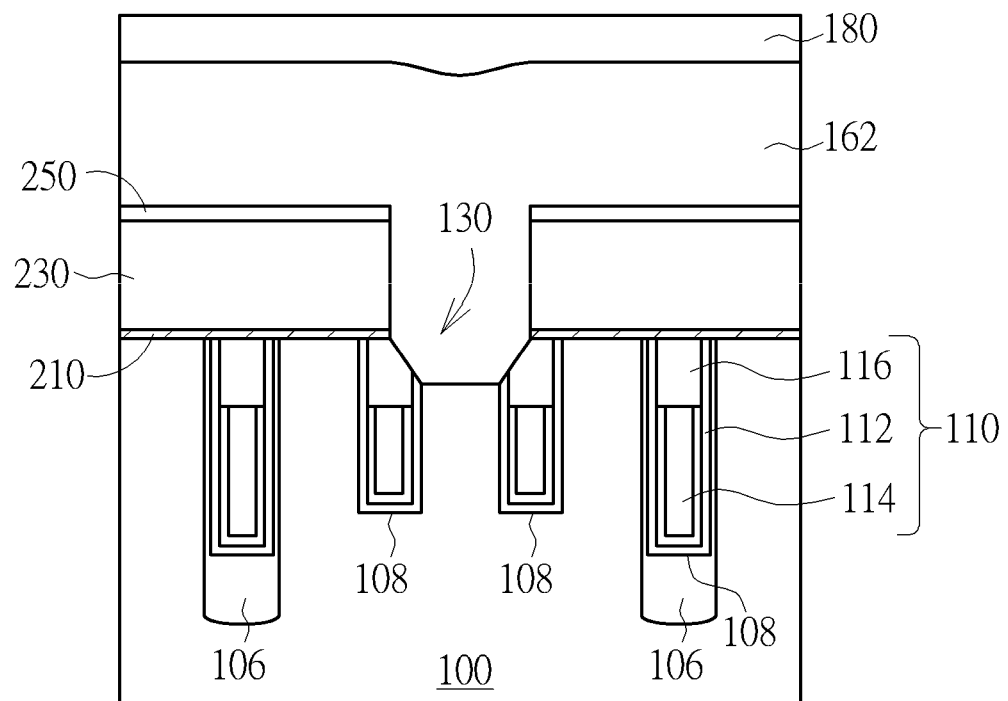

Please refer to FIGS. 7-11, which are schematic diagrams illustrating a forming method of a semiconductor memory device according to the second preferred embodiment of the present invention. The formal forming process of the present embodiment is substantially the same or similar to those in the first preferred embodiment as shown in FIGS. 1-4, and those steps will not be redundantly described herein. The difference between the present embodiment and the aforementioned first preferred embodiment is in that a sacrificial layer 180 is additionally formed on the conductive layer 162 via a chemical vapor deposition, after forming the conductive layer 162 as shown in FIG. 4. The sacrificial layer 180 for example includes a material having better gap-filling capacity or lighter loading effect, to improve the etching profile of the conductive layer 162 in the subsequent etching back process. In one embodiment, the sacrificial layer 180 may include undoped silicon or polysilicon, so that, the sacrificial layer 180 may fill in the lower, sunken top surface of the conductive layer 162 to perform a planar top surface thereby, as shown in FIG. 7.

Figure 8:
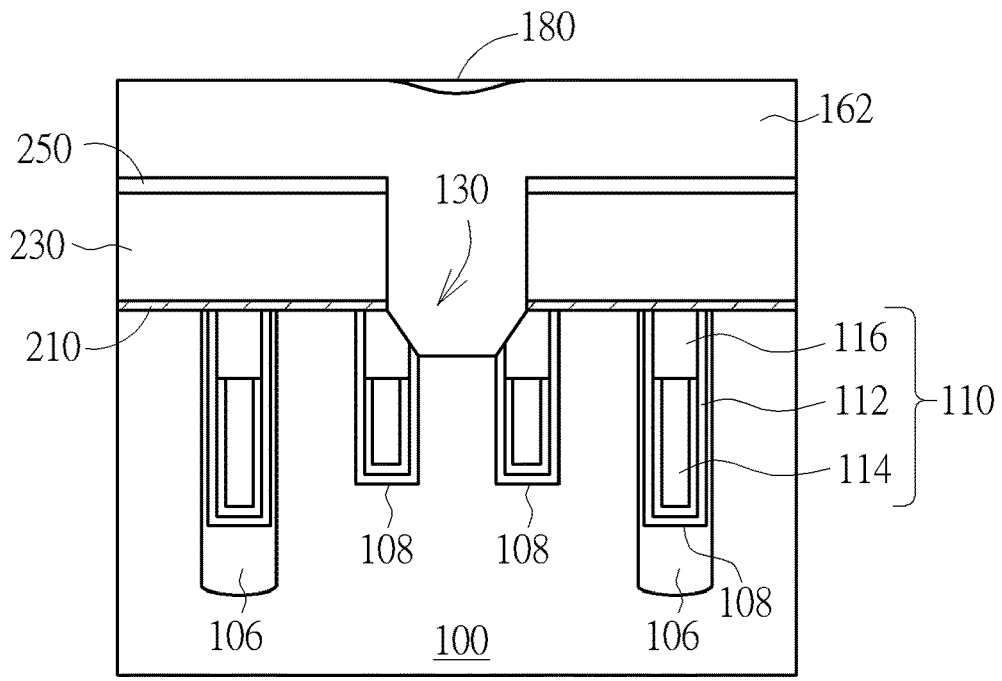
Figure 9:
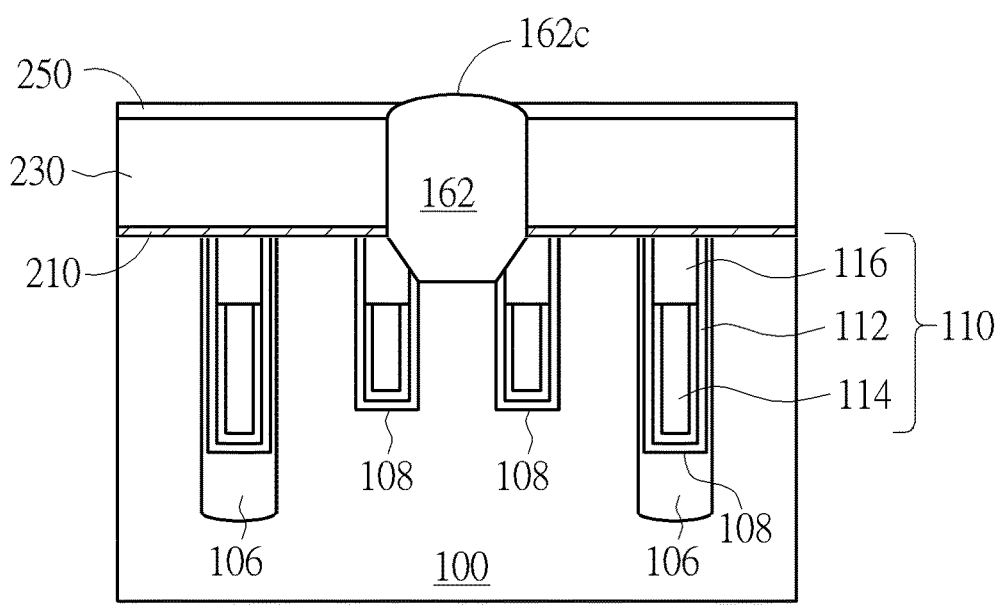
Figure 10:
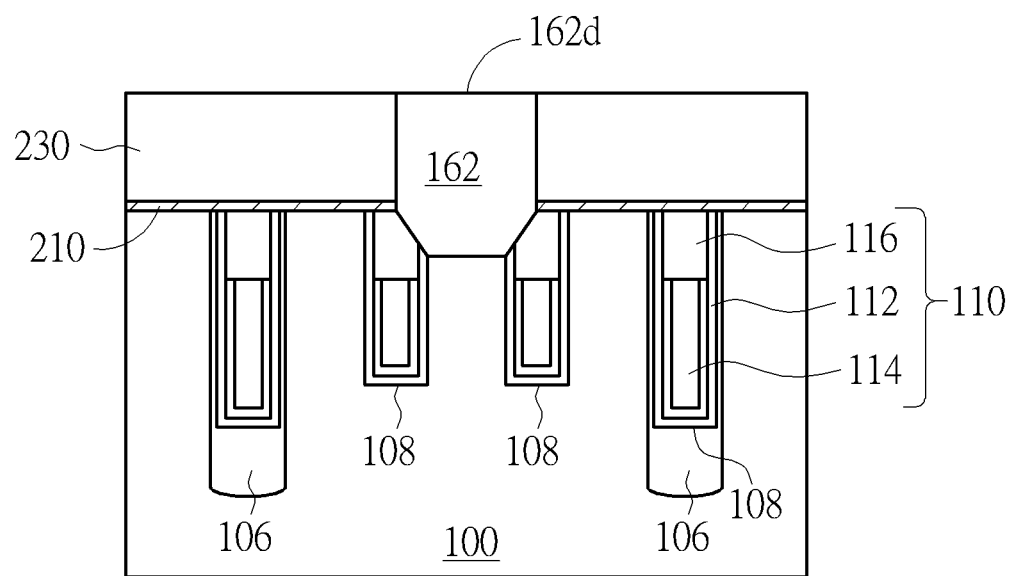

Then, an etching back process such as a dry etching process is performed, to completely remove the sacrificial layer 180 and the conductive layer 162 on the protection layer 250. It is noted that, the etching back process is preferably performed by using an etchant having relative similar etching rate on the sacrificial layer 180 and the conductive layer 162, to conduct a three-stepped etching process. In the first stepped etching process, the majority of the sacrificial layer 180 is removed to expose the top surface of the conductive layer 162 underneath. In this stage, only a small portion of the sacrificial layer 180 remains disposing on the lower, sunken top surface of the conductive layer 162, so that, the remained sacrificial and the conductive layer 162 may still perform a planar top surface together, as shown in FIG. 8. Next, a second-stepped etching process is performed by completely remove the remained sacrificial layer 180, and the conductive layer 162 disposed on the protection layer 250. In this stage, the remained sacrificial layer 180 is used to compensate the etching profile caused by the loading effect of the conductive layer 162, to improve the different etching performances at various portions of the conductive layer 162 like the portion adjacent to the protection layer 250 and the center portion. That is, the taper protrusions 162b as shown in the aforementioned embodiment may no longer be formed on the conductive layer 162 filled in the plug hole 130, and the conductive layer 162 of the present embodiment may perform a slight arched top surface 162c as shown in FIG. 9 thereby. Then, the third-stepped etching process is performed by continuously etching the conductive layer 162 filled in the plug hole 130 until the top surface of the conductive layer 162 being substantially leveled with the top surface of the semiconductor layer 230 at two sides thereof, as shown in FIG. 10. After that, the protection layer 250 is removed, completely.

Figure 11:
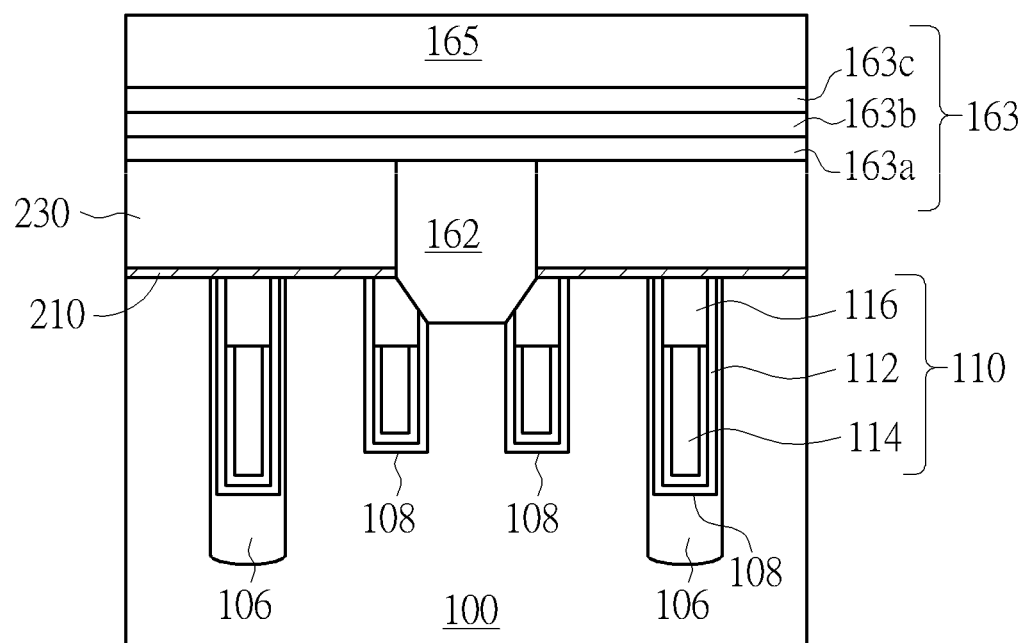

In the subsequent processes of the present embodiment, a barrier layer 162 such as including a Ti layer 163a, a TiN layer 163b and a WSi layer 163c as shown in FIG. 11, and a conductive layer 165 for example including tungsten are formed on the conductive layer 162, to form a stack structure. Then, the stack structure is patterned to form the bit lines 160 as shown in FIG. 1.

Through above mentioned process, the forming method of a semiconductor memory device according to the second preferred embodiment of the present invention is completed. According to the forming processes of the present embodiment, the sacrificial layer 180 is additionally formed on the conductive layer 162 optionally before the etching back process, to compensate the etching profile possibly caused by the loading effect of the conductive layer 162, so as to avoid the different etching performances on different portions of the conductive layer 162. Thus, the conductive layer 162 of the present embodiment may therefore obtain a planar top surface 162d after the etching back process, to let the stack structure formed subsequently on the conductive layer 162 also obtain a planar top surface as shown FIG. 11. In other words, the method of the present embodiment is able form the bit line contacts 160a with a planar top surface, so that, the bit lines 160 as well as the stack structure formed thereon on those bit line contacts 160a may also obtain a planar top surface. That is the semiconductor memory device obtain in the present embodiment may therefore gain a preferably device structure under a simplified process flow.

Figure 12:
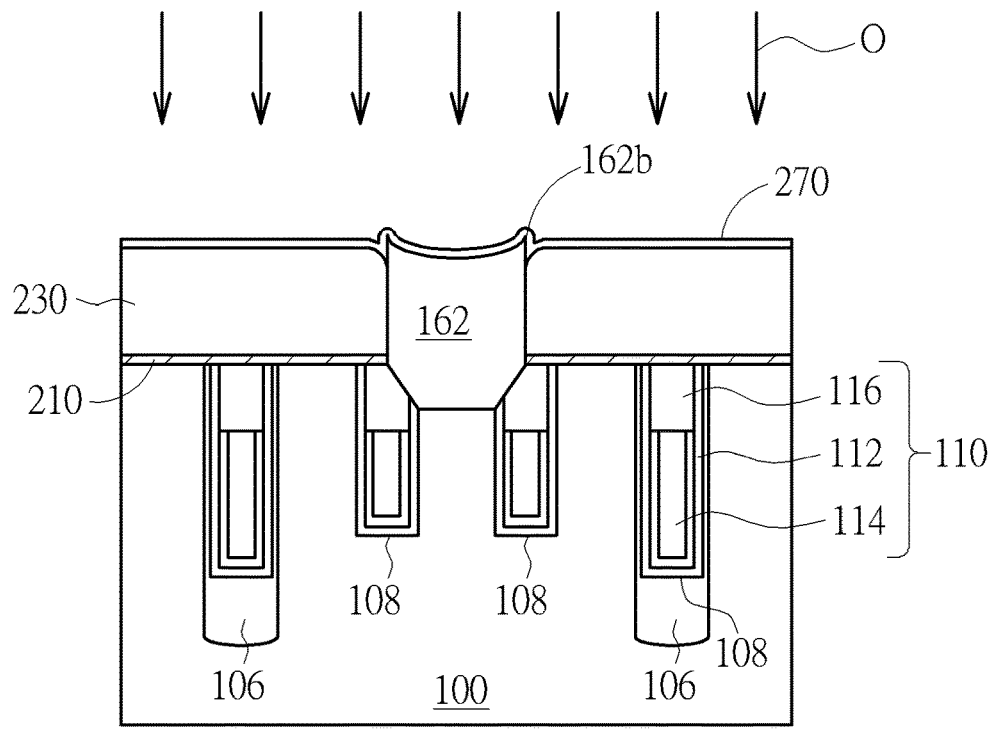
FIG. 12 is a schematic diagrams illustrating a method of forming a semiconductor memory device according to a third preferred embodiment of the present invention.

Please refer to FIG. 12, which is a schematic diagram illustrating a forming method of a semiconductor memory device according to the third preferred embodiment of the present invention. The formal forming process of the present embodiment is substantially the same or similar to those in the first preferred embodiment as shown in FIGS. 1-6, and those steps will not be redundantly described herein. The difference between the present embodiment and the aforementioned first preferred embodiment is in that an oxygen treatment process O is additionally performed after forming the conductive layer 162 as shown in FIG. 6, to form an oxide layer 270 on the top surfaces of the conductive layer 162 and the semiconductor layer 230.

Precisely speaking, the oxygen treatment process O is uniformly performed and reacts with the top surfaces of each exposed film. In the present embodiment, since the taper protrusion 162b is protruded beyond other elements, the reaction of the oxygen treatment process O on the taper protrusion 162b may be further significant and severe. Following these, a cleaning process such as a wet chemical cleaning process by using hydrofluoric acid (DHF) and water solution is performed to remove the taper protrusion 162b. That is, the conductive layer 162 may also obtain a similar top surface as shown in FIG. 10, after the cleaning process. In the subsequent process of the present embodiment, the barrier layer and the conductive layer may still be formed sequentially on the conductive layer 162, for forming the bit lines 160 as shown in FIG. 1.

Through above mentioned process, the forming method of a semiconductor memory device according to the third preferred embodiment of the present invention is completed. According to the forming processes of the present embodiment, the additionally oxygen treatment process O is performed after the etching back process, to oxidize the taper protrusion 162b and the top surface of the semiconductor layer 230 at two sides thereof. In this way, the taper protrusion 162b may be easily removed through a subsequent performed cleaning process. Thus, the method of the present embodiment is able to obtain the bit line contacts 160a with a planar top surface, so that, the bit lines 160 as well as the stack structure (such as the barrier layer and the conductive layer) formed thereon on those bit line contacts 160a may also obtain a planar top surface. That is, the semiconductor memory device obtain in the present embodiment may therefore gain a preferably device structure under a simplified process flow.

Figure 13:
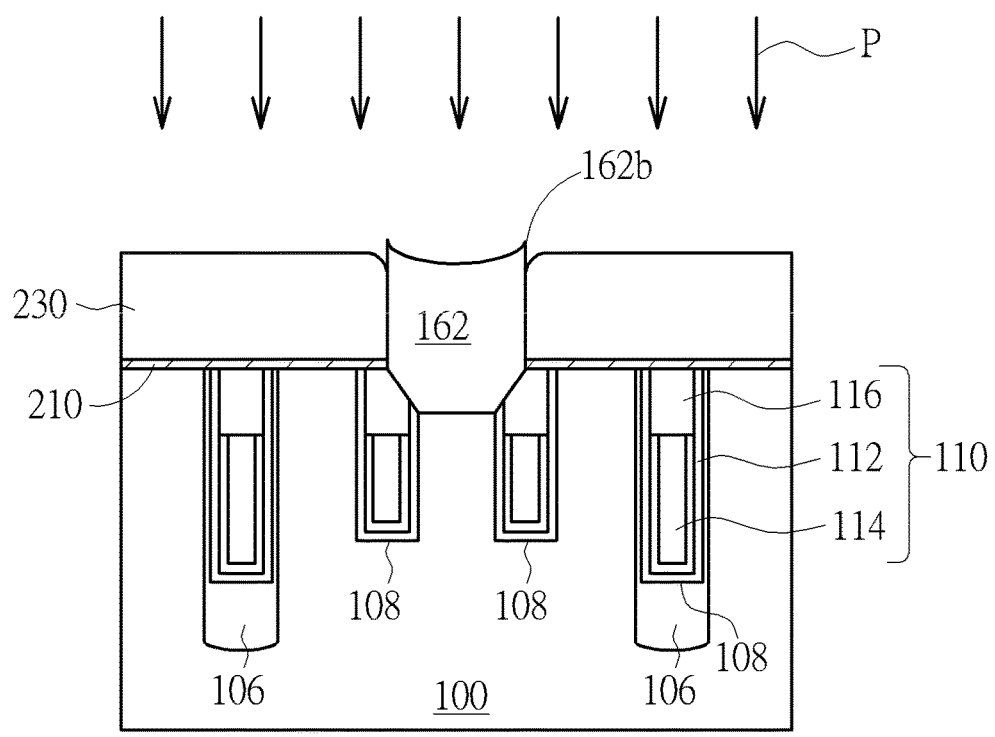
FIG. 13 is a schematic diagrams illustrating a method of forming a semiconductor memory device according to a fourth preferred embodiment of the present invention.

Please refer to FIG. 13, which is a schematic diagram illustrating a forming method of a semiconductor memory device according to the fourth preferred embodiment of the present invention. The formal forming process of the present embodiment is substantially the same or similar to those in the first preferred embodiment as shown in FIGS. 1-6, and those steps will not be redundantly described herein. The difference between the present embodiment and the aforementioned first preferred embodiment is in that a chemical mechanical polishing (CMP) process P is additionally performed after forming the conductive layer 162 as shown in FIG. 6, to directly remove the taper protrusion 162b to obtain a similar top surface 162d as shown in FIG. 10. In the subsequent process of the present embodiment, the barrier layer and the conductive layer may still be formed sequentially on the conductive layer 162, for forming the bit lines 160 as shown in FIG. 1.

Through above mentioned process, the forming method of a semiconductor memory device according to the fourth preferred embodiment of the present invention is completed. According to the forming processes of the present embodiment, the additionally CMP process P is performed after the etching back process, to directly remove the taper protrusion 162b. However, under the concept of the present invention, the CMP process P of the present embodiment is not limited to be performed after the etching back process, and which may be further adjusted according to the practical requirement of products. For example, in one embodiment, a CMP process may also be performed after forming the conductive layer 162 as shown in FIG. 4 via the chemical vapor deposition, to completely remove the conductive layer 162 disposed on the protection layer 250, and the protection layer 250, and to partially remove the conductive layer 162 filled in the plug hole 130. Otherwise, in another embodiment, a CMP process may also be performed optionally after forming the conductive layer 162 as shown in FIG. 5 through the etching back process, to completely remove the taper protrusion 162b and the protection layer 250. Through the above-mentioned processes, the method of the present embodiment is also able to obtain the bit line contacts 160a with a planar top surface, so that, the bit lines 160 as well as the stack structure (such as the barrier layer and the conductive layer) formed thereon on those bit line contacts 160a may also obtain a planar top surface. That is, the semiconductor memory device obtain in the present embodiment may therefore gain a preferably device structure under a simplified process flow.

Overall speaking, the forming method of the present invention utilizes the additionally formed sacrificial layer and the oxide layer or the additionally performed chemical mechanical polishing process and cleaning process rather before or after etching back the conductive layer, to sufficiently remove the protruding etching profiles caused by the loading effect of the conductive layer. Through the above mentioned forming method, it is allowable to obtain the bit line contacts with planar top surfaces, as well as the stacked layers (such as the barrier layer and the conductive layer) over the bit lines also with planar top surface. That is, the forming method of the present invention may therefore obtain a semiconductor memory device with a preferable structure under a simplified process flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
   providing a substrate;
   forming a plurality of gates in the substrate, extending along a first direction;
   forming a semiconductor layer on the substrate, covering the gates;
   forming a protection layer on the semiconductor layer;
   forming a plug hole in the semiconductor layer;
   forming a conductive layer on the protection layer having a lower sunken top surface above the plug hole;
   forming a plug in the semiconductor layer, between two adjacent gates, wherein the forming of the plug comprises;
   performing an etching process to remove the conductive layer on the semiconductor layer till a peripheral top surface of the conductive layer is level with a top surface of the protection layer;
   removing the protection layer, wherein a peripheral top surface of the plug is protruded from the top surface of the semiconductor layer, and the peripheral top surface of the plug not directly contacts the semiconductor layer to form the plug;
   performing a deposition process to from a stacked structure on the semiconductor layer; and
   patterning the stacked structure to form a plurality of bit lines, wherein the bit lines directly contact the semiconductor layer for electrical connection with one of the bit lines directly in contact with the plug.

2. The method of forming a semiconductor memory device according to claim 1, wherein after the etching process, a taper protrusion is formed on the conductive layer.

* * * * *